(12) United States Patent
Waltrich et al.

(10) Patent No.: US 12,745,342 B2
(45) Date of Patent: Sep. 22, 2026

(54) PRINTED CIRCUIT BOARD AND METHOD OF MANUFACTURING THE SAME

(71) Applicant: Rolls-Royce Deutschland Ltd & Co KG, Blankenfelde-Mahlow (DE)

(72) Inventors: Uwe Waltrich, Forchheim (DE); Stanley Buchert, Herzogenaurach (DE)

(73) Assignee: ROLLS-ROYCE DEUTSCHLAND LTD & CO KG, Blankenfelde-Mahlow (DE)

( * ) Notice: Subject to any disclaimer, the term of this patent is extended or adjusted under 35 U.S.C. 154(b) by 144 days.

(21) Appl. No.: 18/699,516

(22) PCT Filed: Oct. 18, 2022

(86) PCT No.: PCT/EP2022/078987
§ 371 (c)(1),
(2) Date: Apr. 8, 2024

(87) PCT Pub. No.: WO2023/072682
PCT Pub. Date: May 4, 2023

(65) Prior Publication Data

US 2024/0407077 A1 Dec. 5, 2024

(30) Foreign Application Priority Data

Oct. 25, 2021 (DE) ..................... 10 2021 127 647.0

(51) Int. Cl.
*H05K 1/02* (2006.01)
*H05K 3/00* (2006.01)

(52) U.S. Cl.
CPC ......... *H05K 1/0204* (2013.01); *H05K 3/0044* (2013.01); *H05K 2201/10409* (2013.01);
(Continued)

(58) Field of Classification Search
None
See application file for complete search history.

(56) References Cited

U.S. PATENT DOCUMENTS 4,907,124 A 3/1990 Kaufman
7,104,805 B2 * 9/2006 Hjort ..................... H01R 12/52 439/74
(Continued)

FOREIGN PATENT DOCUMENTS

CN 102573376 A 7/2012
CN 105744722 A 7/2016
(Continued)

OTHER PUBLICATIONS

German Search Report for German Application No. 10 2021 127 647.0 mailed Jul. 8, 2022.
(Continued)

*Primary Examiner* — Krystal Robinson
(74) *Attorney, Agent, or Firm* — Lempia Summerfield Katz LLC

(57) ABSTRACT

A circuit board includes a plurality of circuit board layers arranged one on top of the other, wherein through-holes are integrated in the circuit board, wherein the through-holes are configured to receive metal screws that screw the circuit board to a heat sink. Insulating sleeves made of an insulating material are integrated into the circuit board, wherein the through-holes are formed in the circuit board in the region of the insulating sleeves.

20 Claims, 5 Drawing Sheets

(52) U.S. Cl.
CPC .............. *H05K 2201/10416* (2013.01); *H05K 2203/0228* (2013.01)

(56) References Cited

U.S. PATENT DOCUMENTS

| | | | | |
|---|---|---|---|---|
| 2008/0019111 | A1* | 1/2008 | Zeng | H05K 7/142 361/810 |
| 2010/0142166 | A1 | 6/2010 | Chang | |
| 2018/0235071 | A1* | 8/2018 | Barrass | H05K 3/32 |

FOREIGN PATENT DOCUMENTS

| | | | |
|---|---|---|---|
| CN | 209218448 | U | 8/2019 |
| CN | 210840180 | U | 6/2020 |
| DE | 4237763 | A1 | 5/1994 |
| DE | 102004006381 | A1 | 10/2004 |
| DE | 102016214519 | A1 | 2/2018 |
| JP | 2002009471 | A | 1/2002 |

OTHER PUBLICATIONS

International Search Report and Written Opinion for International App. No. PCT/EP2022/078987 mailed Feb. 13, 2023.

* cited by examiner

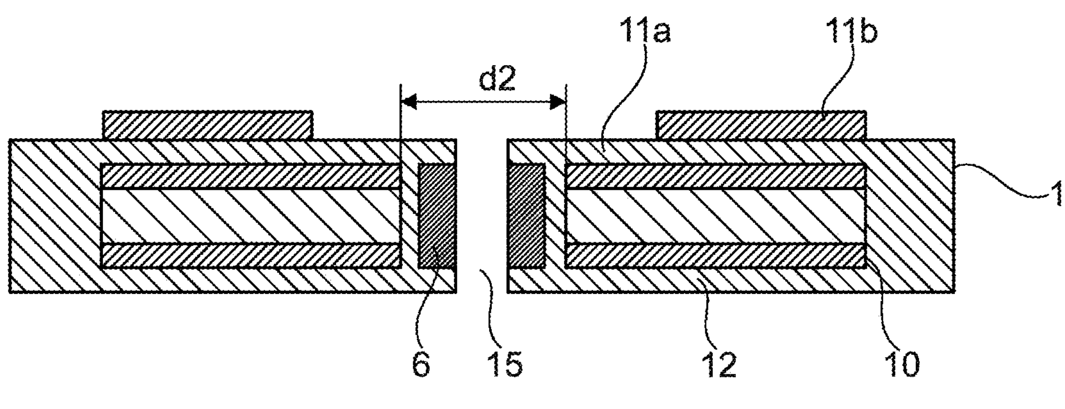
Fig. 1
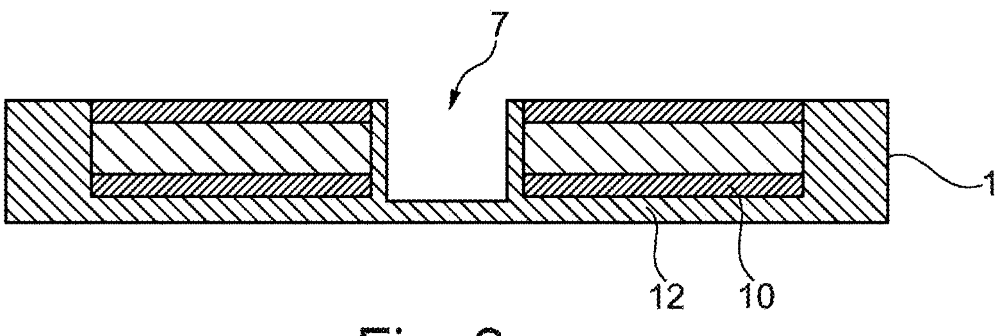
Fig. 2a
7
6
1
71
12
10
Fig. 2b

PRINTED CIRCUIT BOARD AND METHOD OF MANUFACTURING THE SAME

The present patent document is a § 371 nationalization of PCT Application Serial No. PCT/EP2022/078987, filed Oct. 18, 2022, designating the United States, and this patent document also claims the benefit of German Patent Application No. 10 2021 127 647.0, filed Oct. 25, 2021, which are incorporated by reference in their entireties.

TECHNICAL FIELD

The disclosure relates to a circuit board and to a method for the production thereof.

BACKGROUND

It is known to produce circuit boards in a layer structure from a plurality of prepregs, in some cases printed circuit board cores (PCB cores) and copper layers, which are connected to one another and structured by lamination and etching processes. Prepregs are glass fiber mats impregnated with epoxide (prepreg="pre-impregnated fibers"). Precompressed layerings having a copper foil-prepreg-copper foil sequence are referred to as printed circuit board cores.

In accordance with the standard EN IEC 60664-1, which relates to the design of clearances and creepage distances, a solid insulation may be assumed between individual prepreg layers, which is why no clearances and creepage distances have to be observed here. However, various failures may occur along a prepreg layer (e.g., a delamination of the prepreg layers), so that a solid insulation between two potentials cannot be assumed within a layer, and instead a creepage distance may be assumed in accordance with the specified standard. A creepage distance is the shortest distance allowed along the surface of an insulating material between two conductive parts.

Creepage distances in the layers of a circuit board are also maintained at the rim of the circuit board and thus also at the circumferential surface of through-holes in the circuit board. In particular, it is customary to insert metal screws into through-holes in the circuit board, which connect the circuit board to a heat sink and which thus rest on the heat sink potential. Accordingly, it is necessary to provide creepage distances around the circumference of the through-holes in the inner layers and outer layers, which creepage distances maintain a certain creepage distance.

Maintaining creepage distances in the layers of a circuit board to through-holes in the circuit board disadvantageously leads to large electrically unused regions of the circuit board. Because the screw connections, and thus the through-holes, have to be close to the active components of a circuit board arrangement in order to be able to appropriately press them against the cooling surface of the heat sink, each through-hole and screw connection close to the active components represents a significant influence on the electrical performance of the circuit board that leads to a limited current-carrying capacity or a reduced copper cross-section and also, because of the reduced copper cross-section, to an additional parasitic electrical inductance and an additional resistance.

This problem is further aggravated by the fact that the through-holes in the circuit board may be reinforced by an annular copper layer on the surface of the circuit board and additional copper vias. A reinforcement of the through-hole is expedient here, because the screw head of the metal screws may otherwise sink into the soft prepreg material of the uppermost layer of the circuit board and damage the circuit board. By using such additional copper layers and copper vias, the distances to the through-hole to be provided in the individual circuit board layers for the realization of the creepage distance are increased even more, so that the unused regions of the circuit board continue to increase.

SUMMARY AND DESCRIPTION

The disclosure is based on the object of providing a circuit board that allows effective use of even those regions of a circuit board that adjoin through-holes in the circuit board.

This object is achieved by a circuit board and a method as described herein. The scope of the present disclosure is defined solely by the appended claims and is not affected to any degree by the statements within this summary. The present embodiments may obviate one or more of the drawbacks or limitations in the related art.

In a first aspect, a circuit board has a plurality of circuit board layers arranged one on top of the other. Integrated into the circuit board are through-holes configured to receive metal screws that screw the circuit board to a heat sink. Insulating sleeves made of an insulating material are integrated into the circuit board, the through-holes being formed in the circuit board in the region of the insulating sleeves.

The disclosure is based on the idea of increasing the usable regions of a circuit board by preventing copper vias from being formed in the through-holes of the circuit board and instead each being replaced by an insulating sleeve, the through-holes being formed in the insulating sleeves. By avoiding copper vias, it is possible for the metal layers of the circuit board to be brought closer to the through-holes while maintaining the required creepage distances. The disclosure thus allows better utilization of circuit board surfaces in the region of the fastening bores. At the same time, sufficient mechanical strength in the region of the through-holes is provided by the insulating sleeves, wherein the through-holes are reinforced by the insulating sleeves.

The solution thereby makes it possible to reduce the distances of both the metal inner layers and the metal outer layers of the circuit board relative to the through-hole.

Another advantage is to allow an increased copper cross-section within the circuit board, because a copper layer may further extend to the through-holes and accordingly form a larger total surface area. This in turn allows an increased power density, improved miniaturization compared to fastenings of the circuit board to a heat sink according to the prior art and an improvement of the thermal connection by increasing the copper content in the circuit board.

An insulating material refers to any non-conductor and thus any material with an electrical conductivity at 20° C. of less than $10^{-8}$ S·cm$^{-1}$ (or which has at 20° C. a specific resistance of more than $10^{8}$ Ω·cm). "S" is the unit of measure of the electrical conductance. Embodiments provide that the creepage current resistance provided by the insulating material has a CTI value (CTI="comparative tracking index") that is at least 175, in a range of 175 to 600, or in a range of 400 to 600. The insulating material thus provides a high electrical insulation.

Further parameters of the insulating material relate to its thermo-mechanical strength and its thermal expansion coefficient. A high thermo-mechanical strength may thus be provided in order to absorb the pressing forces transmitted on the one hand by the screw head of a metal screw inserted into the through-opening and on the other hand by a pressed-on heat sink. Furthermore, the insulating material may have a coefficient of thermal expansion that corresponds to the coefficient of thermal expansion of the circuit board material, so that no gaps or stresses arise between the insulating material and the circuit board material during temperature changes. As already stated, the circuit board material is formed in particular by prepreg layers (e.g., from FR-4) as non-conducting carrier material and metal layers, e.g., copper layers.

One embodiment provides that the insulating sleeve has a mechanical compressive strength that is greater than the mechanical compressive strength of the non-conductive material of the circuit board layers, e.g., the prepreg layers including FR 4. This provides that the insulating sleeves mechanically reinforce the through-holes of the circuit board without reinforcement by copper vias being required.

The insulating material may be selected from a large number of electrical insulating materials. Embodiments provide that the insulating material is formed by a plastics material or glass fiber reinforced plastics material or a ceramic. Examples of suitable ceramics are aluminum oxide ($Al_2O_3$), zirconium (IV)-oxide ($ZrO_2$), and silicon nitride ($Si_3N_4$). Examples of suitable glass fiber reinforced plastics materials are polyamides filled with glass fibers (e.g., PA GF30) and polycarbonates filled with glass fibers (e.g., PC GF30).

As already mentioned, the insulating material may have a CTI value of the creepage current resistance of at least 175, in the range of 175 to 600, in the range of 400 to 600 (CTI="comparative tracking index").

One embodiment provides that the insulating sleeves are embedded in a milled-in cavity of the circuit board. As a result, the insulating sleeves may subsequently be integrated into the circuit boards in a simple manner. The insulating sleeves are prefabricated from the insulating material and inserted into the milled-in cavity.

Furthermore, an intermediate layer made of plastics material may be formed between the insulating sleeve and the circuit board, wherein the intermediate layer forms an outer sleeve that surrounds the insulating sleeve. Such an intermediate layer may be formed by an epoxide resin or a silicone. The formation of an intermediate layer makes it possible to arrange the insulating sleeve in the circuit board without a gap. After the insulating sleeve has been inserted into a milled-in cavity, the intermediate layer may thus be pressed into a free volume that may be present between the insulating sleeve and the rim of the cavity.

A further embodiment provides that the insulating sleeve is covered by an uppermost circuit board layer and/or a lowermost circuit board layer of the circuit board. As a result, the insulating sleeve is completely integrated into the circuit board. In principle, however, it is alternatively possible for the insulating sleeve to extend into the outermost circuit board layers of the circuit board.

An embodiment provides that an additional metal surface (e.g., copper surface) is formed on the upper side and/or the underside of the circuit board above or below the insulating sleeve. This additional metal surface provides additional mechanical rigidity on the upper side of the circuit board in the region at which the screw head of the metal screw rests on the circuit board, and/or on the underside of the circuit board in the region pressed against a heat sink.

In this case, the additional metal surface may be formed on the uppermost circuit board layer and/or on the lowermost circuit board layer and additionally extend into microbores of the corresponding circuit board layer, whereby an additional metallization of the uppermost or lowermost circuit board layer is provided in the region of the through-hole in order to further reinforce the rigidity of the circuit board in this region. The microbores may be formed as blind holes.

A further embodiment provides that at least some of the metal layers present in the circuit board extend up to the outer rim of the insulating sleeve, wherein, in the case of a metal screw screwed into the through-hole, a sufficient creepage distance between the corresponding metal layer and the metal screw is realized by the insulating sleeve. The dimensions of the insulating sleeve are thus such that the metal layers may project up to the insulating sleeve, so that the regions of the circuit board layers reaching the through-holes may be used optimally.

The designation of the insulating sleeve as a "sleeve" is made only insofar as the insulating sleeve surrounds the through-hole and in this respect represents a sleeve for the through-hole. However, the shape of the insulating sleeve is not limited to a cylindrical shape or-after forming the through-hole in the insulating sleeve-a hollow-cylindrical shape (which is also referred to as cylindrical within the meaning of the present disclosure). For example, the insulating sleeve may be cuboid (with a rectangular cross-section). In principle, the insulating sleeve may also assume other shapes, (e.g., a cone).

In a further aspect, a method is provided for producing a circuit board as described herein. The method includes: providing a circuit board having a plurality of circuit board layers arranged one on top of the other; milling a cavity into the circuit board, the cavity involving (e.g., passing through) at least some of the circuit board layers of the circuit board; inserting an insulating sleeve made of an insulating material into the cavity; filling a free volume in the cavity, which extends between the inserted insulating sleeve and the rim of the cavity, with a plastics material, when such a free volume is present after the insulating sleeve has been inserted; and drilling a through-hole through the insulating sleeve.

One embodiment for this provides that, when a cavity is milled into the circuit board, the cavity ends above the lowermost circuit board layer of the circuit board, so that the cavity does not form a through-hole, but rather a blind hole in the circuit board. This makes it easier to insert the insulating sleeve into the cavity in the subsequent act.

A further embodiment of the method provides that after the insulating sleeve has been inserted and the free volume in the cavity is filled up, the circuit board is provided on its upper side with a non-conductive circuit board layer that covers the insulating sleeve at the top. As a result, the insulating sleeve is completely covered outwardly, and the handling of the introduction of a metal screw may be carried out in a manner known per se on a conventional circuit board layer.

A further embodiment provides that an additional metal surface or copper surface is formed on the upper side and/or the underside of the circuit board above or below the insulating sleeve. This increases the mechanical rigidity on the upper side or the underside of the circuit board. In this case, the additional metal surface in the region of the uppermost circuit board layer and/or in the region of the lowermost circuit board layer may additionally extend into microbores in the corresponding circuit board layer in order to locally mechanically strengthen the corresponding circuit board layer.

The filling of a free volume in the cavity with a plastics material may be accomplished, for example, by the free volume being filled with epoxide resin in a pressing process.

BRIEF DESCRIPTION OF THE DRAWINGS

The disclosure is explained in more detail below with reference to the figures of the drawing based on a plurality of embodiments. In the drawings:

FIG. 1 depicts a schematic sectional view of an embodiment of a circuit board into which an insulating sleeve made of an insulating material is integrated, a through-hole being formed in the region of the insulating sleeve.

FIG. 2*a*-2*e* schematically depict an example of a method for producing a circuit board according to FIG. 1.

DETAILED DESCRIPTION

For better understanding of the background of the present disclosure, a circuit board arrangement according to the prior art is first described with reference to FIG. 4.

Figure 4:
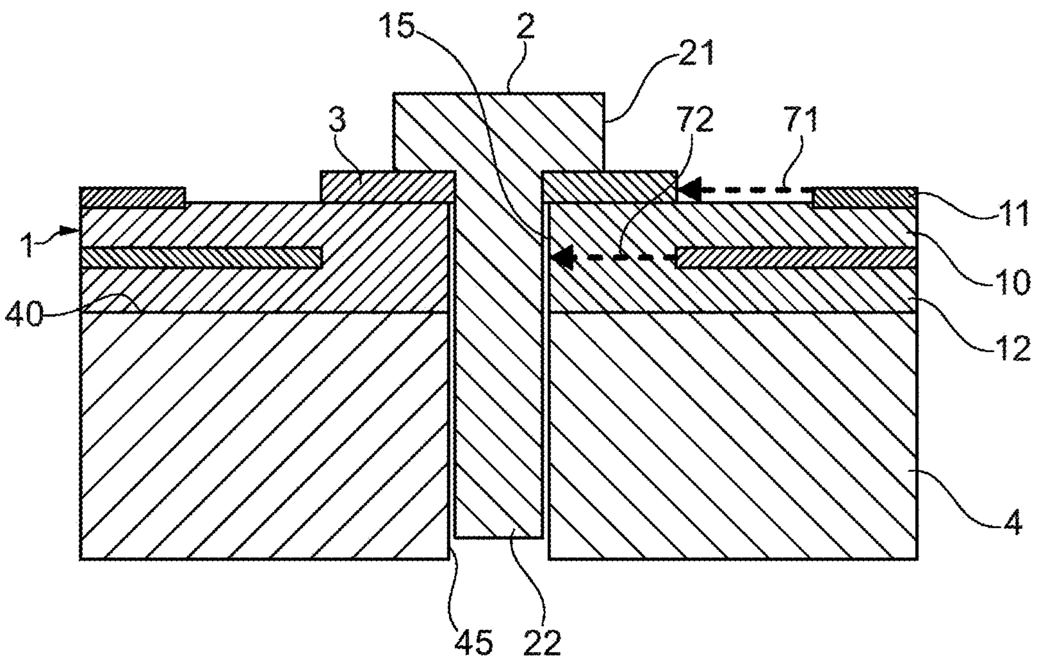
FIG. 4 depicts an example of a circuit board according to the prior art, the circuit board being screwed to a metallic heat sink by metal screws.

FIG. 4 shows a circuit board arrangement that includes a circuit board 1 and a metallic heat sink 4. The circuit board 1 includes a plurality of circuit board layers 10 arranged one on top of the other. An uppermost circuit board layer 11 forms an upper side of the circuit board 1 and a lowermost circuit board layer 12 forms an underside of the circuit board 1.

The circuit board 1 is screwed to the heat sink 4 by metal screws 2. The metal screws 2 are inserted into through-holes 15 in the circuit board and extend into a corresponding opening 45 of the heat sink, which is provided, for example, with an internal thread (not shown). The metal screws 2 have a screw head 2 and a screw shank 22, the screw head 2 resting against the upper side of the circuit board 1 via a metallic washer 3 and the screw shank 22 being screwed into the opening 45 of the heat sink 4 through the through-hole 15 of the circuit board 1.

By the screws 2, the underside of the circuit board 1 is pressed against the surface 40 of the heat sink 4 in order to provide a good thermal transition.

The heat sink 4 includes a metal such as aluminum or an aluminum alloy and is thus electrically conductive. It may be on the ground potential or alternatively a different potential. This means that the metal screw 2 coming into contact with the heat sink 4 is also subjected to the ground potential or the other potential of the heat sink 4.

The individual circuit board layers 10 of the circuit board 1 are formed, for example, by prepreg layers, (e.g., glass fiber mats impregnated with epoxide), and copper layers, which are connected to each other and structured in a manner known per se by lamination and etching processes. The circuit board 1 may also contain printed circuit board cores (PCB cores). Within the meaning of the present disclosure, no distinction is made between prepreg layers and printed circuit board cores. The contours of the circuit board 1 are realized with milling and drilling processes. In accordance with the standard EN IEC 60664-1 for the design of clearances and creepage distances, a solid insulation is assumed between individual prepreg layers (in the vertical direction of FIG. 6), so that no clearances and creepage distances have to be observed between prepreg layers. However, the risk of failures exists along a prepreg layer (horizontal plane of FIG. 6), (e.g., by delamination of the prepreg layers), so that a solid insulation between two potentials within a layer cannot be assumed. Accordingly, creepage distances, which indicate the shortest permitted distance along the surface between two conductive parts, are to be taken into account within a prepreg layer.

Figure 6:
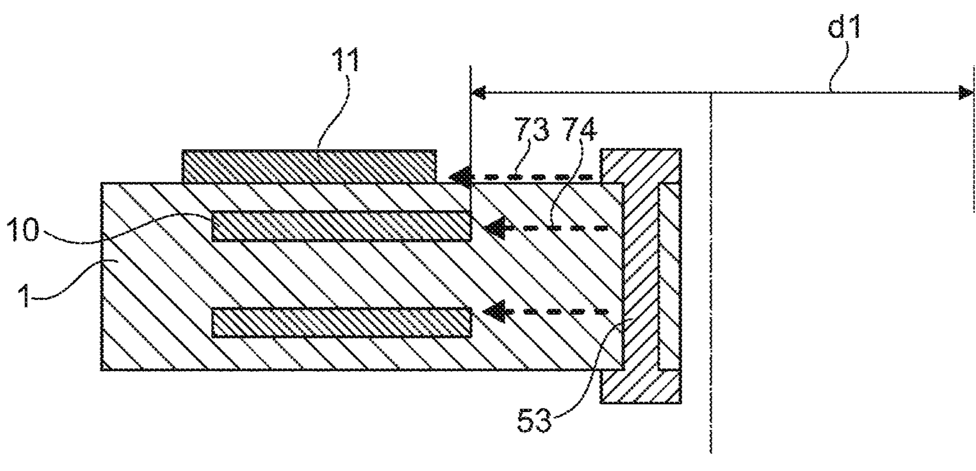
FIG. 6 schematically depicts the representation of required distances between metal layers of the circuit board when the through-hole is provided with additional copper layers according to FIG. 5.

Because the screws 2 are subjected to the ground potential (or a different potential of the heat sink 4), creepage distances are also provided within the prepreg layers 10. Such a creepage distance 72 is shown in FIG. 6. A further creepage distance 71 relates to the distance between a copper layer and the washer 3 on the upper side of the circuit board 1. The need for providing creepage distance 72 in the individual prepreg layers leads to unused rim regions around the through-holes 15. As a result, the copper cross-section is reduced at each fastening point, and the electrical performance of the circuit board 1 is impaired.

Figure 5:
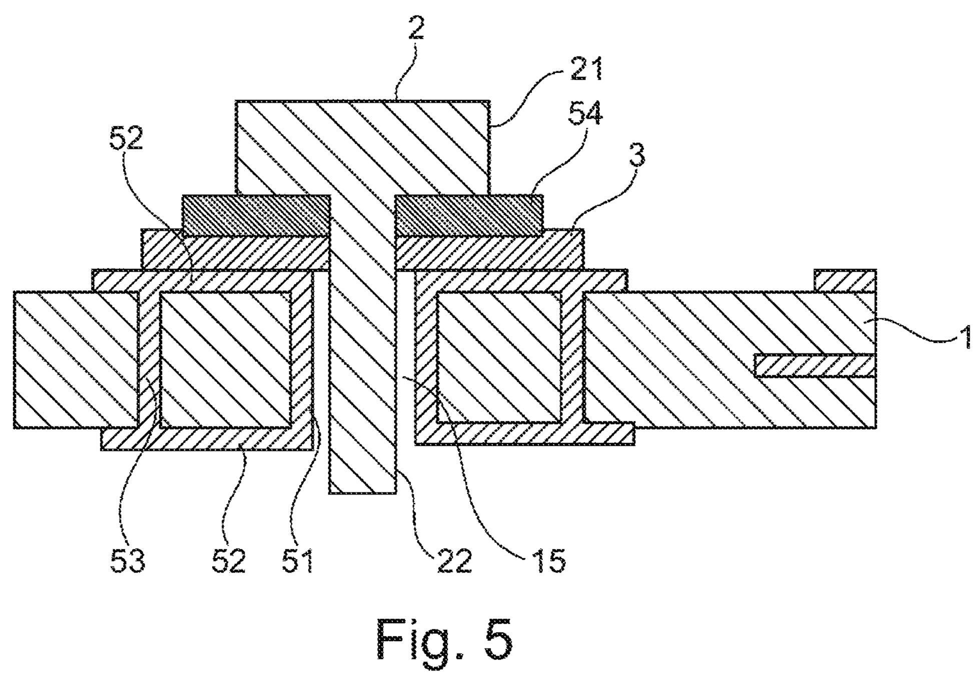
FIG. 5 depicts an example of a circuit board according to FIG. 4, the through-hole in the circuit board being reinforced by an annular copper layer on the surface of the circuit board and a through-plating made of copper (copper via).

FIG. 5 shows a variant of the circuit board of FIG. 4 according to the prior art, in which a through-plating (via) 51 made of copper is formed in the through-hole 15 of the circuit board 1 in order to reinforce the through-hole 15, which represents the screw hole for the metal screw 2. In order to secure the connection and adhesive strength of the through-plating 51 in the through-hole 15, further copper structures are provided, namely on the one hand copper layers 52 on the upper side or underside of the circuit board, and copper channels 53, which extend perpendicularly in the circuit board 1 at a distance from the through-hole 50. Furthermore, an additional annular copper layer 54 may be provided, for example between the washer 3 and the screw head 21 (or vice versa).

FIG. 6 illustrates what such additional copper structures 51-53 mean for providing a through-plating for the creepage distances and thus the minimum distances of the copper layers of the circuit board from the through-hole 15. For example, creepage distances 73, 74 are to be maintained on the upper side and in the inner layers between the copper structures 53 and the copper layers 10, 11. The non-usable region on the upper side of the circuit board 1 around the through-hole 15 is characterized here as d1. It may be in the range of 12 mm to 20 mm.

FIG. 1 shows a first embodiment of a circuit board 1. The heat sink 4 shown in FIG. 4 is no longer shown and may be designed in accordance with FIG. 4 or in another way.

The circuit board 1 includes a plurality of circuit board layers 10 arranged one on top of the other. An uppermost circuit board layer 11 forms an upper side of the circuit board 1 and a lowermost circuit board layer 12 forms an underside of the circuit board 1. For forming the circuit board layers 10, reference is made to the description of FIG. 4. The circuit board layers 10 are thus formed, for example, by prepreg layers and copper layers. One or more of the circuit board layers 10-12 may also be formed jointly by a prepreg layer and one or more copper layers. For example, in FIG. 1, the uppermost layer is formed by a prepreg layer 11*a* (for example from FP-4) and a copper layer 11*b* that is also formed thereon.

The circuit board 1 has a through-hole 15 that, together with further corresponding through-holes 15, is used to fix the circuit board 1 to a heat sink by metal screws. An insulating sleeve 6 is integrated into the circuit board 1 in the region of the through-hole 15. In the embodiment shown, the insulating sleeve 6 extends between the uppermost layer 11*a* and the lowermost layer 12, thus being covered by them. Alternatively, the insulating sleeve 6 may extend up to the corresponding surface and thus also through the uppermost layer 11*a* and the lowermost layer 12.

The through-hole 15 extends through the insulating sleeve 6. It is thus formed as a bore through the uppermost circuit board layer 11*a*, the insulating sleeve 6, and the lowermost circuit board layer 12. If, according to the aforementioned alternative embodiment, the insulating sleeve 6 extends to the corresponding surface of the circuit board 1, the through-hole 15 is formed exclusively in the insulating sleeve 6.

The insulating sleeve 6 includes an insulating material that may be formed by any non-conductor. It may be formed by a glass fiber reinforced plastics material or a ceramic. Examples of suitable insulating materials are aluminum oxide ($Al_2O_3$), zirconium (IV)-oxide ($ZrO_2$), silicon nitride ($Si_3N_4$), polyamides filled with glass fibers (e.g., PA GF30), and polycarbonates filled with glass fibers (e.g., PC GF30).

The material of the insulating sleeve 6 is harder and has a higher mechanical compressive strength than the non-conductive material of the circuit board 1, so that a mechanical stability for the through-hole 15 is provided by the insulating sleeve 6, which allows the formation of through-platings and additional copper layers on the surface of the circuit board according to FIGS. 5 and 6 for reinforcing the through-hole 15 to be avoided. The non-usable region on the upper side of the circuit board 1 around the through-hole 15 is thereby reduced to a diameter d2, which is smaller than the diameter d1 of FIG. 6 and may be in the range of 6 mm to 10 mm.

Furthermore, it may be provided that the insulating material has a CTI value of the creepage current resistance of at least 175, in the range of 175 to 600, or in the range of 400 to 600. The insulating material thus has a high electric strength.

Furthermore, the insulating material may also have a high thermo-mechanical strength in order to absorb the pressing forces that occur when a screw head introduces forces into the circuit board 1 and presses it against a heat sink.

The insulating material furthermore may have a coefficient of thermal expansion that corresponds to the coefficient of thermal expansion of the non-conductive material of the circuit board (e.g., of the prepreg layers) or does not deviate from this substantially (for example, at most 20% relative to the coefficient of thermal expansion of the prepreg layers). This provides that there is no occurrence of stresses or gaps between the insulating sleeve and the circuit board material when there are temperature changes.

It is pointed out that the insulating sleeve 6 in FIG. 1 is dimensioned such that the copper inner layers 10 (e.g., the copper layers of the inner circuit board layers) may project as far as the insulating sleeve 6. The metal layers of the circuit board may thus be brought as close as possible to the through-hole 15 while maintaining the required creepage distances.

FIGS. 2*a* to 2*e* show an example of a method for producing a circuit board according to FIG. 1. According to FIG. 2*a*, a cavity 7 is formed in a circuit board 1. This is milled, for example, from above into the circuit board 1. In the illustrated embodiment, the cavity 7 ends above the lowermost circuit board layer 12, so that the layer forms a receiving floor for an insulating sleeve to be inserted. Alternatively, the cavity 7 extends completely through the circuit board 1, in which case a temporary base for supporting the insulating sleeve is to be provided below the circuit board 1.

According to FIG. 2*b*, the insulating sleeve 6 is then inserted into the cavity 7. In this case, it may be provided that a free volume 71 extends between the outer surface of the insulating sleeve 6 and the rim of the cavity 7. Whether this is the case or not depends of course on the dimensions of the insulating sleeve 6 to be inserted. If the insulating sleeve 6 is inserted into the cavity 7 with a press fit, for example, the free volume 71 is omitted.

Figure 2C:
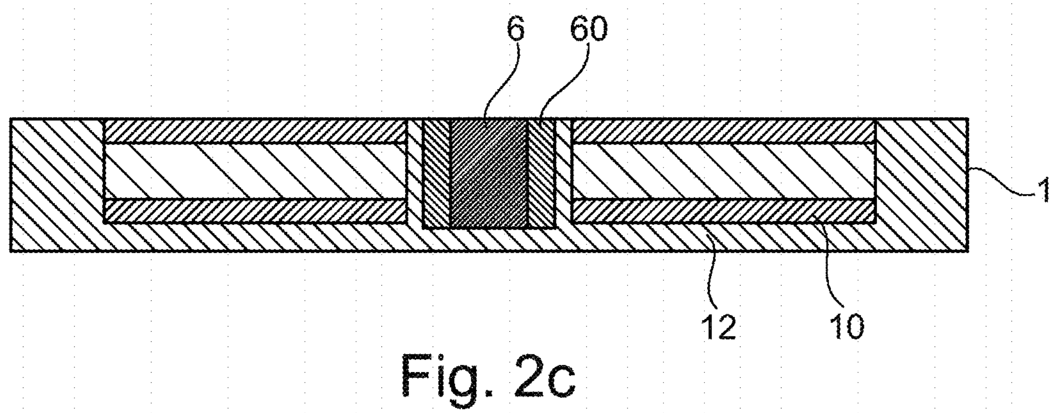

If a free volume 71 is present corresponding to FIG. 2*b*, it is filled with a plastics material 60 according to FIG. 2*c*. For this purpose, for example, an epoxide resin 60 is pressed into the free volume 71. The plastics material 60 may also have a greater hardness and mechanical compressive strength than the non-conductive material of the circuit board 1. The intermediate layer 60 thus forms an outer sleeve for the insulating sleeve 6. It may be regarded as a part of an insulating sleeve 6 that includes two successive layers in the radial direction.

Figure 2D:
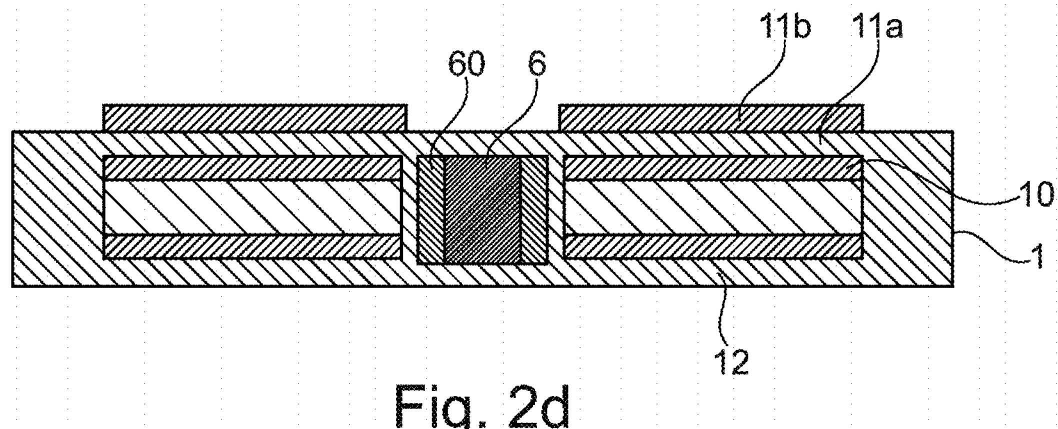
Figure 2E:
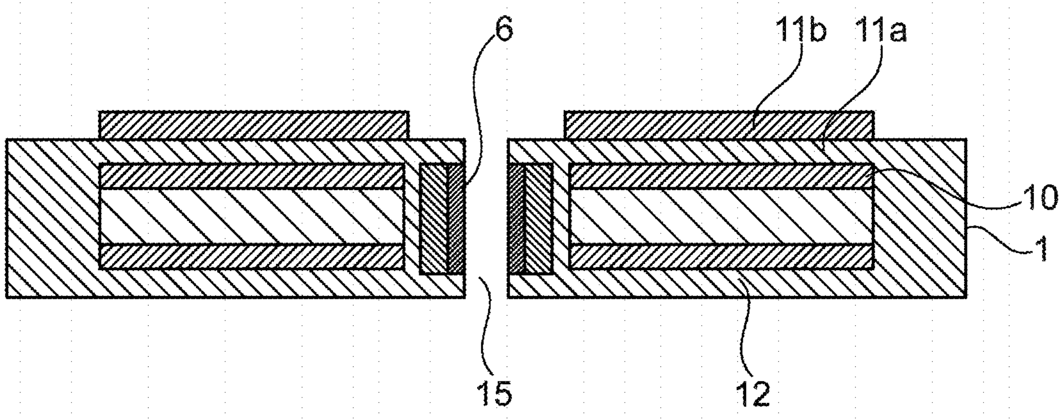

According to FIG. 2*d*, an upper circuit board layer (prepreg layer) 11*a* is then applied to the circuit board 1 and covers the insulating sleeve 6 at the top. Furthermore, additional copper layers 11*b* may be formed on the upper side of the circuit board 1. Finally, according to FIG. 2*e*, the through-hole 15 is introduced that extends through the insulating sleeve 6.

Figure 7:
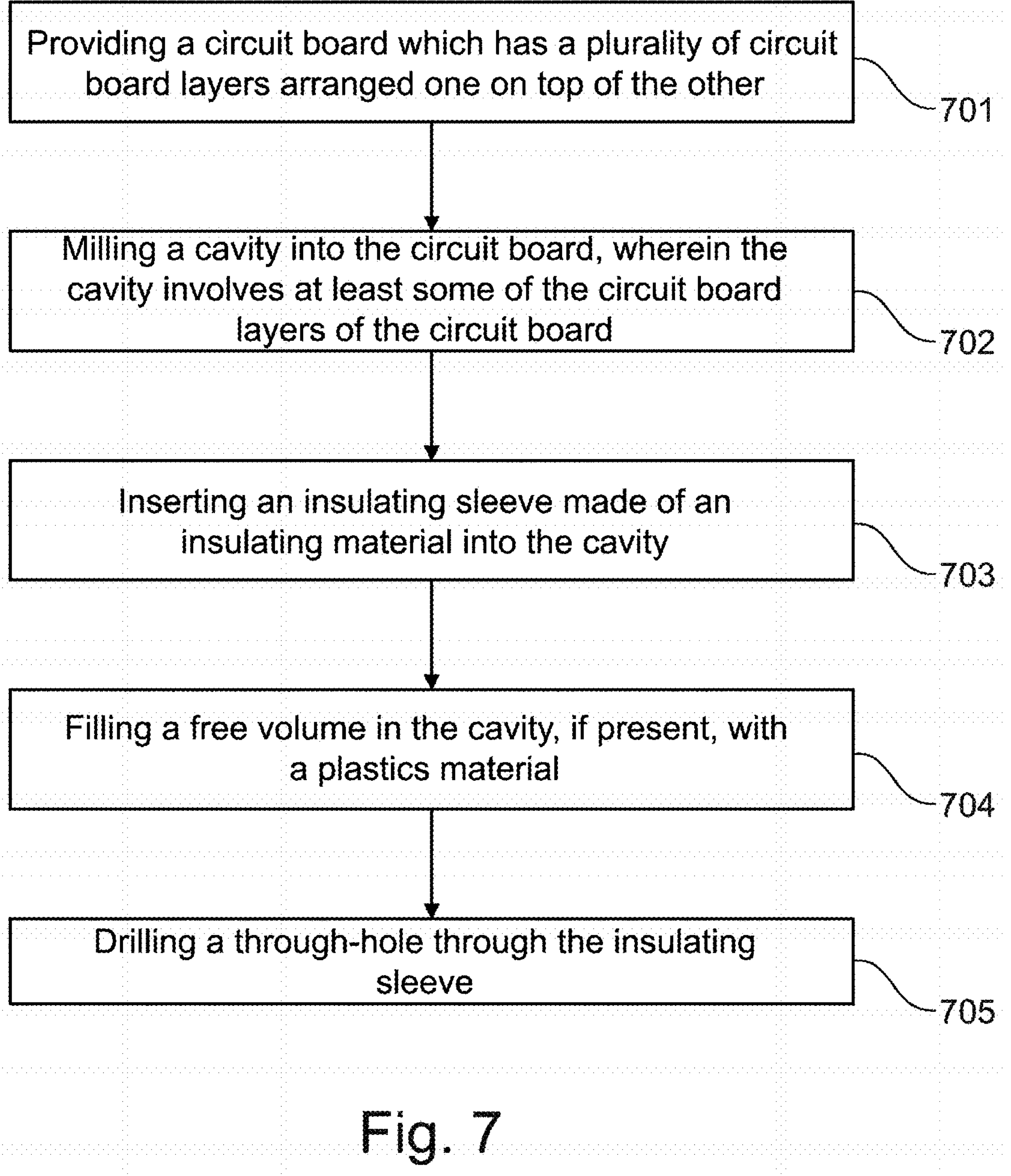
FIG. 7 depicts an example of a flowchart of a method for producing a circuit board.

FIG. 7 in summary shows a flowchart of such a method for producing a circuit board arrangement. According to act 701, a circuit board is first provided that has a plurality of circuit board layers arranged one on top of the other. According to act 702, a cavity is milled into the circuit board, the cavity involving at least some of the circuit board layers of the circuit board. According to act 703, an insulating sleeve made of an insulating material is then inserted into the cavity.

If present, a free volume in the cavity that extends between the inserted insulating sleeve and the rim of the cavity is filled with a plastics material, for example, an epoxide resin, in act 704. Finally, a through-hole is drilled through the insulating sleeve in act 705.

Figure 3:
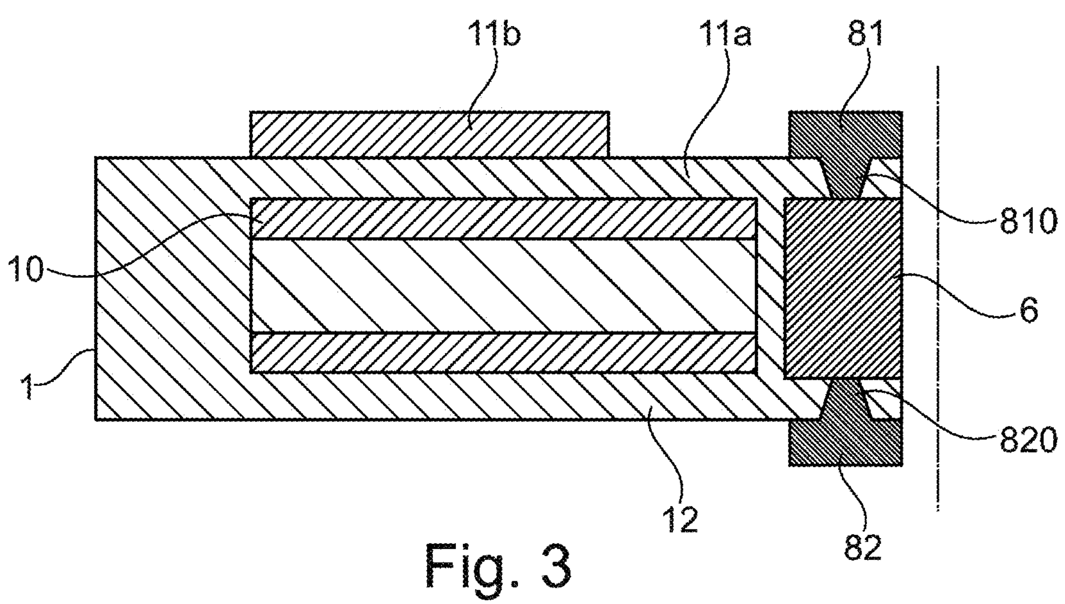
FIG. 3 depicts an example of a modification of the circuit board of FIG. 1, wherein an additional metal surface is formed on the upper side and/or the underside of the circuit board.

FIG. 3 shows a modification of the circuit board of FIG. 1, in which an additional copper surface 81, 82 is applied to the uppermost or lowermost circuit board layer 11*a*, 12 in addition above and below the insulating sleeve 6. In this case, the additional copper surface 81, 82 extends into microbores 810, 820 of the corresponding circuit board 11*a*, 12. By the additional copper surfaces 81, 82 and the microbores 810, 820, an additional mechanical rigidity of the uppermost circuit board layer 11*a* below the screw head (see screw head 21 of FIG. 4) and the lowermost circuit board layer 12 adjacent to a heat sink is provided.

It is pointed out that the circuit board 1 is shown in the figures only schematically and by way of example. For example, a larger number of circuit board layers may be provided. The circuit board 1 also has a plurality of through-holes 15 for receiving screws. Furthermore, active components (not shown) may be arranged on and/or integrated into the circuit board 1.

The disclosure is not limited to the embodiments described above, and various modifications and improvements may be made without departing from the concepts described herein. Any of the described features may be used separately or in combination with any other features, provided that they are not mutually exclusive. The disclosure extends to all combinations and sub-combinations of one or more features described herein and includes them. If ranges are defined, they include all values within these ranges and all sub-ranges that fall within a range.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A circuit board comprising:
- a plurality of circuit board layers arranged one on top of another;
- through-holes configured to receive metal screws that screw the circuit board to a heat sink being integrated into the circuit board; and
- insulating sleeves integrated into the circuit board,
- wherein the insulating sleeves comprise an insulating material,
- wherein the through-holes are formed in the circuit board in a region of the insulating sleeves, and
- wherein the insulating sleeves have a mechanical compressive strength greater than a mechanical compressive strength of a non-conductive material of the circuit board.

2. The circuit board of claim 1, wherein the insulation material is a plastics material, a glass fiber reinforced plastics material, or a ceramic.

3. The circuit board of claim 1, wherein the insulation material has a comparative tracking index (CTI) value of a creepage current resistance of at least 175.

4. The circuit board of claim 1, wherein the insulating sleeves are embedded in a milled-in cavity of the circuit board.

5. The circuit board of claim 1, wherein an insulating sleeve of the insulating sleeves is covered by an uppermost circuit board layer and/or a lowermost circuit board layer of the circuit board.

6. The circuit board of claim 1, wherein at least some metal layers present in the circuit board extend up to an outer rim of an insulating sleeve of the insulating sleeves, and
- wherein the insulating sleeve is dimensioned such that, in a case of a metal screw of the metal screws screwed into a through-hole of the through-holes, a sufficient creepage distance between the corresponding metal layer and the metal screw is realized by the insulating sleeve.

7. The circuit board of claim 1, wherein each insulating sleeve of the insulating sleeves is cylindrical or cuboid.

8. A circuit board comprising:
- a plurality of circuit board layers arranged one on top of another;
- through-holes configured to receive metal screws that screw the circuit board to a heat sink being integrated into the circuit board; and
- insulating sleeves integrated into the circuit board,
- wherein the insulating sleeves comprise an insulating material,
- wherein the through-holes are formed in the circuit board in a region of the insulating sleeves,
- wherein an intermediate layer made of plastics material is formed between an insulating sleeve of the insulating sleeves and the circuit board, and
- wherein the intermediate layer forms an outer sleeve that surrounds the insulating sleeve of the insulating sleeves.

9. The circuit board of claim 8, wherein the intermediate layer comprises an epoxide resin or silicone.

10. The circuit board of claim 8, wherein the insulation material is a plastics material, a glass fiber reinforced plastics material, or a ceramic.

11. The circuit board of claim 8, wherein the insulation material has a comparative tracking index (CTI) value of a creepage current resistance of at least 175.

12. The circuit board of claim 8, wherein the insulating sleeves are embedded in a milled-in cavity of the circuit board.

13. The circuit board of claim 8, wherein each insulating sleeve of the insulating sleeves is cylindrical or cuboid.

14. A circuit board comprising:
- a plurality of circuit board layers arranged one on top of another;
- through-holes configured to receive metal screws that screw the circuit board to a heat sink being integrated into the circuit board;
- insulating sleeves integrated into the circuit board; and
- an additional metal surface formed on an upper side of the circuit board and/or an underside of the circuit board above or below an insulating sleeve of the insulating sleeves,
- wherein the insulating sleeves comprise an insulating material, and
- wherein the through-holes are formed in the circuit board in a region of the insulating sleeves.

15. The circuit board of claim 14, wherein the insulating sleeve is covered by an uppermost circuit board layer and/or a lowermost circuit board layer of the circuit board, and
- wherein the additional metal surface is arranged on the uppermost circuit board layer and/or the lowermost circuit board layer and extends into microbores of the corresponding circuit board layer.

16. The circuit board of claim 14, wherein the insulation material is a plastics material, a glass fiber reinforced plastics material, or a ceramic.

17. The circuit board of claim 14, wherein the insulation material has a comparative tracking index (CTI) value of a creepage current resistance of at least 175.

18. The circuit board of claim 14, wherein the insulating sleeves are embedded in a milled-in cavity of the circuit board.

19. The circuit board of claim 14, wherein at least some metal layers present in the circuit board extend up to an outer rim of an insulating sleeve of the insulating sleeves, and
- wherein the insulating sleeve is dimensioned such that, in a case of a metal screw of the metal screws screwed into a through-hole of the through-holes, a sufficient creepage distance between the corresponding metal layer and the metal screw is realized by the insulating sleeve.

20. The circuit board of claim 14, wherein each insulating sleeve of the insulating sleeves is cylindrical or cuboid.

* * * * *